(12) United States Patent
Lee

(10) Patent No.: US 8,908,458 B2
(45) Date of Patent: Dec. 9, 2014

(54) SENSE AMPLIFIER CIRCUIT FOR NONVOLATILE MEMORY

(71) Applicant: Yong Seop Lee, Bucheon-si (KR)

(72) Inventor: Yong Seop Lee, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 29 days.

(21) Appl. No.: 13/754,346

(22) Filed: Jan. 30, 2013

(65) Prior Publication Data

US 2014/0043928 A1 Feb. 13, 2014

(30) Foreign Application Priority Data

Aug. 7, 2012 (KR) .................. 10-2012-0086360

(51) Int. Cl.
*G11C 7/02* (2006.01)
*G11C 7/06* (2006.01)

(52) U.S. Cl.
CPC .............. *G11C 7/065* (2013.01); *G11C 7/067* (2013.01); *G11C 7/062* (2013.01); *G11C 2207/063* (2013.01)
USPC .......... 365/208; 365/51; 365/52; 365/185.21; 365/207; 365/196

(58) Field of Classification Search
CPC ............. G11C 7/062; G11C 2207/063; G11C 2211/5641; G11C 7/065; G11C 11/4091
USPC .................. 365/51, 52, 185.21, 207, 53, 196, 365/189.07
See application file for complete search history.

(56) References Cited

U.S. PATENT DOCUMENTS

| 6,512,697 | B1* | 1/2003 | Li et al. ............... 365/185.21 |
| 6,538,476 | B2  | 3/2003 | Forbes |
| 2008/0174290 | A1 | 7/2008 | Ogiwara et al. |
| 2009/0091995 | A1 | 4/2009 | Tsai et al. |

FOREIGN PATENT DOCUMENTS

| JP | 2008-152706 | 7/2008 |
| KR | 1999-0057811 | 7/1999 |
| KR | 10-0441230 | 7/2004 |

OTHER PUBLICATIONS

Abstract for JP 2008152706; http://worldwide.espacenet.com; Jul. 3, 2008.
Abstract for Korean Pat. Registration No. 1019990057811; http://engpat.kipris.or.kr; Sep. 19, 2000.

* cited by examiner

*Primary Examiner* — Thong Q Le
(74) *Attorney, Agent, or Firm* — Andrew D. Fortney; Central California IP Group, P.C.

(57) ABSTRACT

A sense amplifier circuit for a nonvolatile memory that includes a first amplifier to perform a switching operation to output a first signal on a sense amplifier based logic (SABL) node depending on the state of a sensing enable signal, a second amplifier to perform a switching operation to output a second signal on the SABL node depending on the state of the sensing enable signal, a current mirror that sinks current on the SABL node depending on the sensing enable signal and a bit line signal, and an inverter arranged to output the signal on the SABL node as a data signal.

18 Claims, 2 Drawing Sheets

SENSE AMPLIFIER CIRCUIT FOR NONVOLATILE MEMORY

The present application claims priority under 35 U.S.C. §119 to Korean Patent Application No. 10-2012-0086360 (filed on Aug. 7, 2012), which is incorporated herein by reference in its entirety.

FIELD OF THE INVENTION

The present invention relates to a sense amplifier circuit for a nonvolatile memory, and more particularly, to a sense amplifier circuit that reads data from a memory cell according to a sensing enable signal and a bit line signal in a nonvolatile memory.

BACKGROUND

In general, as semiconductor memory devices are scaled in increasingly greater capacity and integration, the number of memory cells included in one chip increases progressively. To effectively control a read/write operation for the memory cells, a certain number of cells are bundled to form a cell matrix, and a number of cell matrices are bundled to form a bank. A bit line and a word line are used for approaching each of a plurality of cells included in a cell matrix.

For dynamic random access memories (DRAMs), which are a type of nonvolatile memory, each of the cells may be configured with one transistor and one capacitor. The word line is generally connected to a gate of the transistor, and the bit line is generally connected to a drain of the transistor. To perform a read/write operation for data stored in one cell, when a word line corresponding to the cell is activated, the transistor forms a channel, and an electric charge stored in the capacitor is transferred to the bit line through the channel. The electric charge transferred to the bit line is weak in intensity, and thus a bit line sense amplifier is used to amplify the electric charge in order for an accurate read/write operation to be performed.

Figure 1:
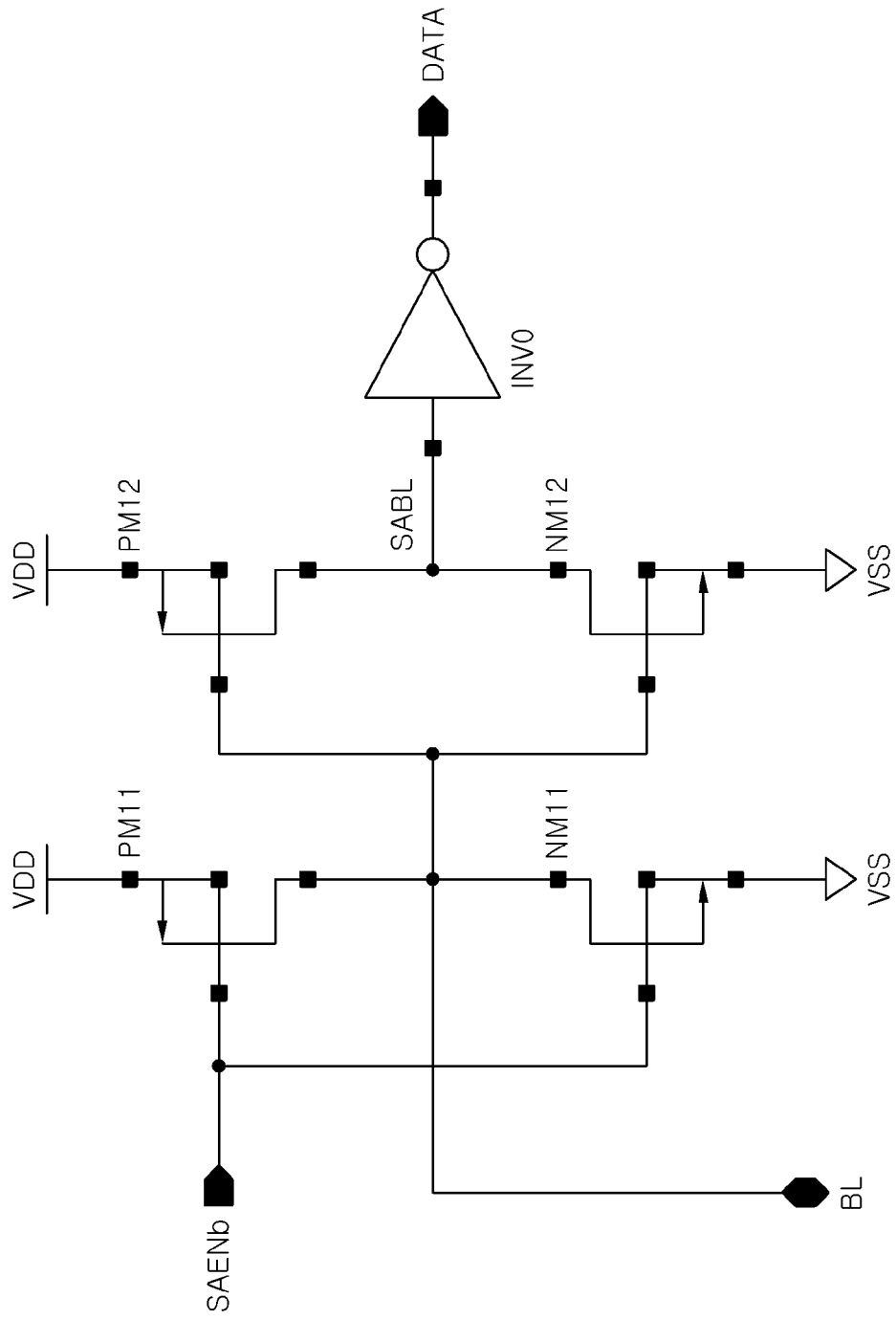

FIG. 1 illustrates a circuit diagram of a conventional sense amplifier circuit for a nonvolatile memory.

As illustrated in FIG. 1, the conventional sense amplifier circuit includes a first PMOS transistor PM11, a second PMOS transistor PM12, a first NMOS transistor NM11, and a second NMOS transistor NM12.

The first PMOS transistor PM11 has a source connected to a source voltage VDD terminal, a bulk connected to the source voltage VDD terminal, a gate connected to a sensing enable node SAENb to which a sensing enable signal is applied, and a drain connected to a bit line node BL to which a bit line signal is applied.

The second PMOS transistor PM12 has a source connected to the source voltage VDD, a bulk connected to the source voltage VDD, a gate connected to a bit line node BL, and a drain connected to a sense amplifier based logic (SABL) node.

The first NMOS transistor NM11 has a source connected to a ground voltage VSS, a bulk connected to the ground voltage VSS, a gate connected to the sensing enable node SAENb, and a drain connected to the bit line node BL.

The second NMOS transistor NM12 has a source connected to the ground voltage VSS, a bulk connected to the ground voltage VSS, a gate connected to the bit line node BL, and a drain connected to the SABL node.

The conventional sense amplifier circuit further includes an inverter INV0 that is connected between the SABL node and a data output terminal DATA. The inverter INV0 logically inverts a signal applied to the SABL node to output the inverted signal on the data output terminal DATA.

The operation of the conventional sense amplifier circuit having the above-described configuration will now be described.

First, when not sensing a memory cell, the sensing enable signal having a logic high is inputted to the sensing enable node SAENb.

The voltage VDD having a logic high is inputted to the gate of the first PMOS transistor PM11 to turn off the first PMOS transistor PM11.

The voltage VDD having a logic high is inputted to the gate of the first NMOS transistor NM11 to turn on the first NMOS transistor NM11, and thus, the ground voltage VSS is outputted on the bit line node BL.

The ground voltage VSS having a logic low is inputted to the gate of the second NMOS transistor NM12 to turn off the second NMOS transistor NM12.

The ground voltage VSS having a logic low is inputted to the gate of the second PMOS transistor PM12 to turn on the second PMOS transistor PM12, and thus the source voltage VDD having a logic high is applied to the SABL node.

The source voltage VDD having a logic high is applied to the SABL node, and thus, 0 V (zero volt) corresponding to a logic low is outputted on the data output terminal DATA. Consequently, a current may not flow in a selected memory cell coupled to the bit line when the ground voltage VSS is applied to the source of the memory cell, and if any current does flow in the selected memory cell, it is sunk by the first NMOS transistor NM11.

However, when an active sensing enable signal (e.g., having a logic low) is inputted to the sensing enable node SAENb, the selected memory cell coupled to the bit line is sensed.

The ground voltage VSS having a logic low is inputted to the gate of the first PMOS transistor PM11 to turn on the first PMOS transistor PM11, and thus the source voltage having a logic high is applied on the bit line node BL. The ground voltage VSS having a logic low is also inputted to the gate of the first NMOS transistor NM11 to turn off the first NMOS transistor NM11.

The source voltage VDD having a logic high is inputted to the gate of the second NMOS transistor NM12 to turn on the second NMOS transistor NM12, and thus the ground voltage VSS having a logic low is applied to the SABL node. The source voltage VDD having a logic high is also inputted to the gate of the second PMOS transistor PM12 to turn off the second PMOS transistor PM12.

The ground voltage VSS having a logic low is applied to the SABL node, and thus, the source voltage VDD having a logic high is outputted on the data output terminal DATA.

When a current does not flow in the selected memory cell, the source voltage VDD having a logic high is outputted on the data output terminal DATA.

Moreover, when current does not flow in the memory cells coupled to the bit line, and a ground voltage VSS is applied to the sources of the memory cells, the active sensing enable signal inputted as a logic low to the sensing enable node SAENb for sensing the memory cell may not have a desired effect.

For example, the ground voltage VSS having a logic low is inputted to the gate of the first PMOS transistor PM11 to turn on the first PMOS transistor PM11, and thus, the source voltage VDD is applied to the bit line node BL. However, since current does not flow in the memory cells, the electric potential of the bit line node BL remains at an electric potential of a logic low.

The ground voltage VSS having a logic low is also inputted to the gate of the first NMOS transistor NM11 to turn off the first NMOS transistor NM11.

A logic low is further inputted to the gate of the second NMOS transistor NM12 to turn off the second NMOS transistor NM12.

A logic low is also inputted to the gate of the second PMOS transistor PM12 to turn on the second PMOS transistor PM12, and thus, the source voltage VDD having a logic high is applied to the SABL node.

The source voltage VDD having a logic high is applied to the SABL node, and thus, the ground voltage VSS having a logic low is outputted on the data output terminal DATA.

When current does not flow in the memory cells coupled to the bit line, the ground voltage VSS having a logic low is outputted on the data output terminal DATA.

In the conventional sense amplifier circuit for a nonvolatile memory, however, the sense amplifier circuit operates when the ground voltage VSS is applied to the source of a memory cell, and particularly, as the amount of a current flowing in the memory cell becomes lower, the length-direction size of the first PMOS transistor PM11 is enlarged. For this reason, a current capable of sensing is limited.

SUMMARY

In view of the above, the present invention provides a sense amplifier circuit for a nonvolatile memory, which is capable of operating even when a voltage VDD is applied to a source of a memory cell.

Further, the present invention provides a sense amplifier circuit for a nonvolatile memory, which is capable of reading out data even when the amount of a current flowing in the memory cell is low.

In accordance with an aspect of the present invention, there is provided a sense amplifier circuit for a nonvolatile memory that includes:

a first current amplifier configured to output a first signal on a sense amplifier output node responsive to or depending on a first voltage and a sensing enable signal;

a second current amplifier configured to output a second signal on the sense amplifier output node responsive to or depending on a second voltage and the sensing enable signal;

a current mirror configured to output a third signal on the sense amplifier output node responsive to or depending on the second voltage, the sensing enable signal, and a bit line signal; and, optionally, an inverter configured to invert the signal on the sense amplifier output node and output a data signal.

In the sense amplifier circuit, the first current amplifier may include a first type MOS transistor, the second current amplifier may include a second type MOS transistor, and the current mirror may include a plurality of the second type MOS transistors.

In the sense amplifier circuit, the first current amplifier may include a MOS transistor having a first terminal to which the first source voltage is applied, a second terminal to which the first source voltage is applied, a third terminal connected to a sensing enable node receiving the sensing enable signal, and a fourth terminal connected to the sense amplifier output node.

In the sense amplifier circuit, the second current amplifier may include a MOS transistor having a first terminal receiving the second voltage, a second terminal receiving the second voltage, a third terminal connected to a sensing enable node receiving the sensing enable signal, and a fourth terminal connected to the sense amplifier output node.

In the sense amplifier circuit, the current mirror may include a MOS transistor having third and fourth terminals receiving the bit line signal.

In the sense amplifier circuit, the current mirror may include a plurality of MOS transistors, wherein two terminals of one of the MOS transistors are connected to a terminal of at least one other MOS transistor.

In the sense amplifier circuit, the current mirror may include:

a first MOS transistor having a first terminal receiving the second voltage, an optional second terminal receiving the second voltage, a third terminal connected to the sensing enable node, and a fourth terminal receiving the bit line signal;

a second MOS transistor having a first terminal receiving the second voltage, an optional second terminal receiving the second voltage, and third and fourth terminals receiving the bit line signal; and a third MOS transistor having a first terminal receiving the second voltage, an optional second terminal receiving the second voltage, a third terminal coupled to the bit line signal, and a fourth terminal connected to the sensing enable node and receiving the sensing enable signal.

In the sense amplifier circuit, the fourth terminal of the first MOS transistor is connected to the third terminal of the second MOS transistor, and the fourth terminal of the second MOS transistor is connected to the third terminal of the third MOS transistor.

DRAWINGS

Figure 2:
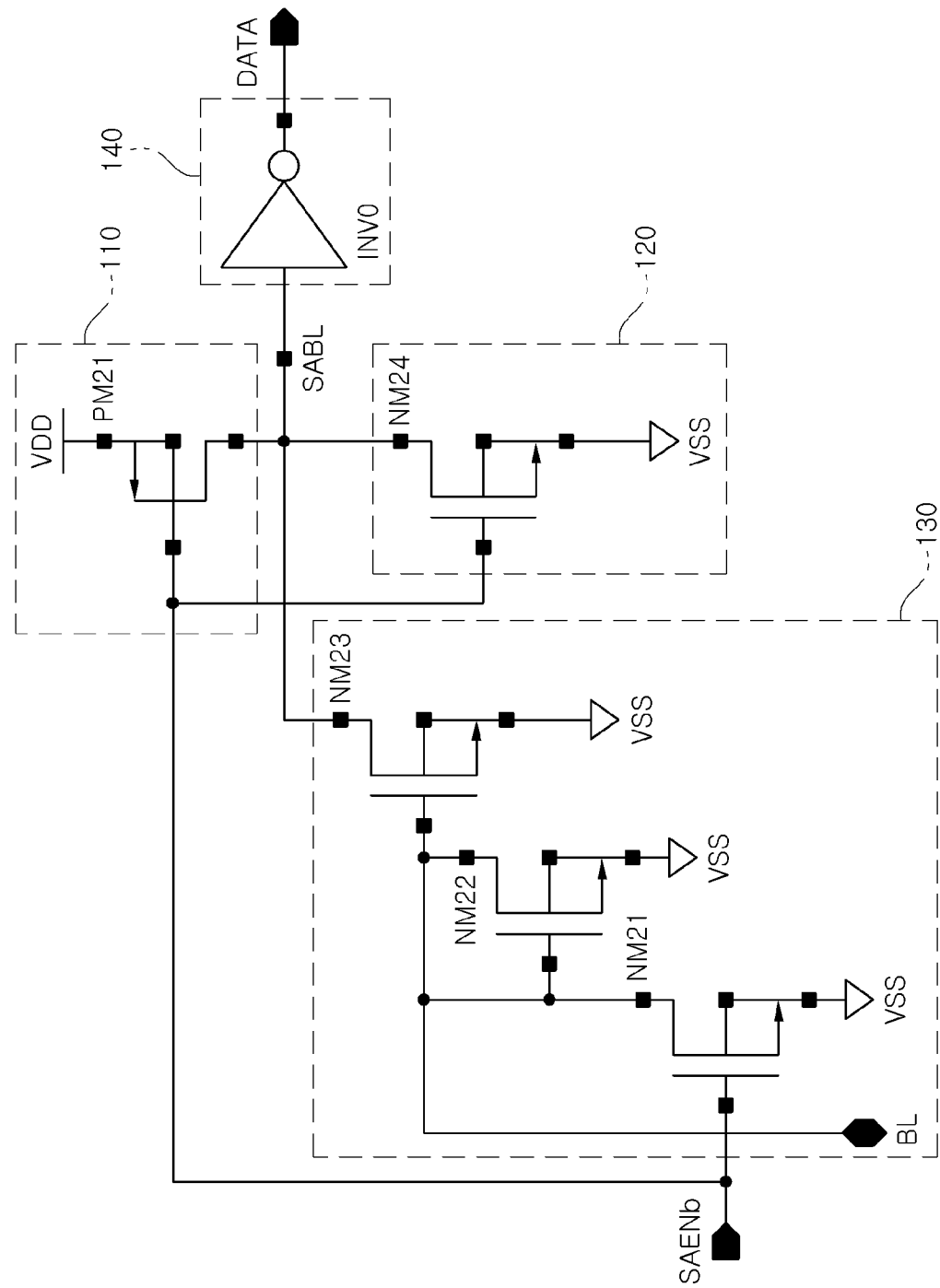

The above and other objects and features of embodiments will become apparent from the following description of various embodiments, given in conjunction with the accompanying drawings, in which:

FIG. 1 illustrates a circuit diagram of a conventional sense amplifier circuit for a nonvolatile memory; and FIG. 2 illustrates an exemplary circuit diagram of a sense amplifier circuit for a nonvolatile memory in accordance with an embodiment of the present invention.

DETAILED DESCRIPTION

The advantages and features of embodiments of the invention and methods of accomplishing these will be clearly understood from the following description of various embodiments taken in conjunction with the accompanying drawings. However, the embodiments of the present invention are not limited to those embodiments described herein, and are intended to cover alternatives, modifications, and equivalents that may be included within the spirit and scope of the invention as such embodiments may be implemented in various forms. It should be noted that the described embodiments are provided to make a full disclosure of the invention and also to allow those skilled in the art to know the full range of the embodiments. Therefore, the invention is to be defined only by the scope of the appended claims.

In the following description, well-known functions, structures or constitutions relating to the present embodiments will be understood by those having skill in the art and, for the sake of clarity, will not be described in detail if they would obscure the invention in unnecessary detail. Further, the terminologies to be described below are defined in the context of the functions and design of embodiments of the present invention and may differ from terms used in the relevant art to describe similar functions or structures. Therefore, the terms used to describe the present invention and its structures and functions should be interpreted based on the context and overall description of the present application.

FIG. 2 illustrates a circuit diagram of a sense amplifier circuit for a nonvolatile memory in accordance with one or more embodiments of the present invention.

As illustrated in FIG. 2, the sense amplifier circuit in accordance with embodiment(s) of the present invention includes a first current amplifier 110, a second current amplifier 120, a current mirror 130, and an optional inverter 140.

The first current amplifier 110 outputs a first signal on a sense amplifier based logic (SABL) node in response to or depending on the value of a sensing enable signal (e.g., on a sensing enable node SAENb). For example, when the sensing enable signal has a logic low value, the first current amplifier 110 performs a switching operation to output a logic high signal (e.g., having a value about equal to the voltage VDD) on the SABL node. However, when the sensing enable signal has a logic high value, the first current amplifier 110 functions as a high impedance node, and has substantially no effect on the value of the signal on the SABL node.

The second current amplifier 120 outputs a second signal on the SABL node in response to or depending on the sensing enable signal on the sensing enable node SAENb. For example, when the sensing enable signal has a logic high value, the second current amplifier 120 performs a switching operation to output a logic low signal (e.g., having a value about equal to the voltage VSS) on the SABL node. However, when the sensing enable signal has a logic low value, the second current amplifier 120 functions as a high impedance node, and has substantially no effect on the value of the signal on the SABL node.

The current mirror 130 outputs a third signal on the SABL node in response to or depending on the sensing enable signal and a bit line signal on a bit line node BL. The current mirror 130 allows the current on the bit line and/or sense amplifier based logic (SABL) node to be sensed, and the memory cell to be read from a value and/or current on the bit line or SABL node, when the sensing enable signal has a logic low value.

The inverter 140 inverts the signal on the SABL node to output the inverted signal on a data output terminal DATA.

The first current amplifier 110 includes a first PMOS transistor PM21, which has a source connected to a first voltage terminal (e.g., VDD), a bulk connected to the first voltage terminal, a gate connected to the sensing enable node SAENb to which the sensing enable signal is applied, and a drain connected to the SABL node.

The second current amplifier 120 includes a fourth NMOS transistor NM24, which has a source connected to a second voltage (e.g., VSS), a bulk connected to the second voltage, a gate connected to the sensing enable node SAENb to which the sensing enable signal is applied, and a drain connected to the SABL node.

The current mirror 130 includes a first NMOS transistor NM21, a second NMOS transistor NM22, and a third NMOS transistor NM23. The second NMOS transistor NM22 has a gate and a drain that receive the bit line signal on the bit line node BL. The first to third NMOS transistors NM21 to NM23 are electrically connected to one another. For example, the drain of NMOS transistor NM21 is connected to the gate of NM22, and the drain and gate of NM22 are connected to the gate of the NMOS transistor NM23.

The first NMOS transistor NM21 has a source to which the second voltage VSS is applied, a bulk to which the second voltage VSS is applied, a gate connected to the sensing enable node SAENb to which the sensing enable signal is applied, and a drain connected to the bit line node BL to which the bit line signal is applied.

The second NMOS transistor NM22 has a source to which the second voltage VSS is applied, a bulk to which the second voltage VSS is applied, a gate connected to the bit line node BL to which the bit line signal is applied, and a drain connected to the bit line node BL to which the bit line signal is applied.

The third NMOS transistor NM23 has a source to which the second voltage VSS is applied, a bulk to which the second voltage VSS is applied, a gate connected to the bit line node BL to which the bit line signal is applied, and a drain connected to the SABL node.

The drain of the first NMOS transistor NM21 is connected to the gate of the second NMOS transistor NM22, and the drain of the second NMOS transistor NM22 is connected to the gate of the third NMOS transistor NM23. The drain of the first NMOS transistor NM21 may also be connected to the gate of the third NMOS transistor NM23.

The operation of the sense amplifier circuit for a nonvolatile memory in accordance with embodiment(s) of the present invention will be described as follows.

First, when not sensing a memory cell, the sensing enable signal having a logic high is inputted on the sensing enable node SAENb.

The voltage VDD having a logic high is inputted to the gate of the first PMOS transistor PM21 to turn off the first PMOS transistor PM21.

The voltage VDD having a logic high is also inputted to the gate of the fourth NMOS transistor NM24 to turn on the fourth NMOS transistor NM24, and thus, the second source voltage VSS having a logic low is inputted on the SABL node.

The voltage VDD having a logic high is further inputted to the gate of the first NMOS transistor NM21 to turn on the first NMOS transistor NM21, and thus, the second source voltage VSS having a logic low is outputted onto the bit line node BL.

The second source voltage VSS having a logic low is also inputted to the gate of the second NMOS transistor NM22 to turn off the second NMOS transistor NM22.

The second source voltage VSS having a logic low is further inputted to the gate of the third NMOS transistor NM23 to turn off the third NMOS transistor NM23.

The second source voltage VSS having a logic low is applied to the SABL node, and thus, the voltage VDD having a logic high is outputted on the data output terminal DATA.

Subsequently, when a current does not flow in a memory cell coupled to the bit line and the voltage VDD is applied to the source of the memory cell, applying the sensing enable signal having a logic low to the sensing enable node SAENb enables effective sensing of the memory cell. Current does not flow in the memory cell, depending on the state of the memory cell (e.g., programmed or erased) and the type of the memory cell (e.g., PMOS or NMOS). For example, in a P type flash memory or EEPROM cell, when the cell is programmed, a current flows in the cell, and when the cell is erased, current does not flow in the cell. However, in the N type flash memory or EEPROM cell, current may flow when the cell is erased and not flow when the cell is programmed.

When applying the sensing enable signal having a logic low to the sensing enable node SAENb, the voltage VSS having a logic low is inputted to the gate of the first PMOS transistor PM21 to turn on the first PMOS transistor PM21, and thus, the voltage VDD having a logic high is applied to the SABL node.

The voltage VSS having a logic low is also inputted to the gate of the fourth NMOS transistor NM24 to turn off the fourth NMOS transistor NM24.

The voltage VSS having a logic low is further inputted to the gate of the first NMOS transistor NM21 to turn off the first NMOS transistor NM21.

When current does not flow in the memory cell and/or because the voltage on the bit line may have been pulled low by the current mirror 130 when the sensing enable signal had a logic high voltage, the voltage VSS having a logic low continues to be inputted to the gate of the second NMOS transistor NM22 to turn off the second NMOS transistor NM22.

The second source voltage VSS having a logic low is thus also inputted to the gate of the third NMOS transistor NM23 to turn off the third NMOS transistor NM23.

The voltage VDD having a logic high is thus applied to the SABL node, and as a result, the voltage VSS having a logic low is outputted on the data output terminal DATA.

Consequently, when a current does not flow in the memory cell, the voltage VSS having a logic low is outputted on the data output terminal DATA.

Moreover, when a current flows in the memory cell by applying the first source voltage VDD to the source of the memory cell, the sensing enable signal having a logic low can be applied to the sensing enable node SAENb for sensing the memory cell.

A voltage VSS (e.g., 0 V or zero volts) corresponding to a logic low is inputted to the gate of the first PMOS transistor PM21 to turn on the first PMOS transistor PM21 when the sensing enable signal at node SAENb is active, and thus, the voltage VDD having a logic high is applied to the SABL node. However, the bit line signal on the bit line node BL generally has a level greater than the threshold voltage of the second NMOS transistor NM22 and the third NMOS transistor NM23 (e.g., substantially at or near the voltage VDD) when current flows in the memory cell. Thus, the SABL node ultimately has a logic low due to current sinking that occurs in the third NMOS transistor NM23 that is turned on.

The voltage VSS having a logic low is inputted to the gate of the fourth NMOS transistor NM24 to turn off the fourth NMOS transistor NM24.

The voltage VSS having a logic low is also inputted to the gate of the first NMOS transistor NM21 to turn off the first NMOS transistor NM21.

The voltage VDD corresponding to the source of the memory cell is inputted to the gate of the second NMOS transistor NM22 to turn on the second NMOS transistor NM22. As a result, a first current Ibit flows on the bit line BL.

The voltage VDD corresponding to the source of the memory cell is also inputted to the gate of the third NMOS transistor NM23 to turn on the third NMOS transistor NM23. When the third NMOS transistor NM23 has a size N times that of the second NMOS transistor NM22, a second current N×Ibit flows on the node SABL.

A logic low may thus be eventually applied to the SABL node, and thus, the voltage VDD having a logic high is outputted on the data output terminal DATA. Also, the current Ibit on the bit line BL may be sensed and amplified by the current mirror 130, so that the data may be reliably read when current flows in the memory cell. Thus, for example, when the SAENb signal is active (e.g., it has a logic low state) and a memory cell coupled to the bit line BL is selected to be read, the state of the data output terminal DATA can indicate whether the selected cell is programmed or not.

When a current does not flow in the memory cell and the SAENb signal is active (e.g., it has a logic low state), the voltage VSS having a logic low may be outputted on the data output terminal DATA. However, when the voltage on the bit line BL is greater than the threshold voltage of the second NMOS transistor NM22 and the third NMOS transistor NM23, and the sense amplifier enable signal SAENb is active, the voltage VDD having a logic high may be outputted on the data output terminal DATA.

Thus, in accordance with embodiment(s) of the present invention, the sense amplifier circuit operates even when a source voltage having a logic high is applied to a source of a memory cell, and moreover, data is read even when the amount of a current flowing in the memory cell is low.

While the invention has been shown and described with respect to certain disclosed embodiments, the present invention is not limited thereto. It will be understood by those skilled in the art that various changes and modifications may be made without departing from the scope of the invention as defined in the following claims.

What is claimed is:

1. A sense amplifier circuit, comprising:
   a first amplifier comprising a first type MOS transistor configured to receive a sensing enable signal and output a first signal on a sense amplifier output node when the sensing enable signal has a first state;
   a second amplifier comprising a second type MOS transistor configured to receive the sensing enable signal and output a second signal on the sense amplifier output node when the sensing enable signal has a second state;
   a current mirror configured to sink a current on the sense amplifier output node when the sensing enable signal has the second state, depending on a voltage or current on a bit line; and
   an inverter configured to output the first or second signal on the sense amplifier output node as a data signal.

2. The sense amplifier circuit of claim 1, wherein the current mirror includes a plurality of the second type MOS transistors.

3. The sense amplifier circuit of claim 1, wherein the first type MOS transistor in the first amplifier includes a first terminal to which a first voltage is applied, a second terminal to which the first voltage is applied, a third terminal connected to a sensing enable node to which the sensing enable signal is applied, and a fourth terminal connected to the sense amplifier output node.

4. The sense amplifier circuit of claim 1, wherein the second type MOS transistor in the second amplifier includes a first terminal to which a second voltage is applied, a second terminal to which the second voltage is applied, a third terminal connected to the sensing enable node, and a fourth terminal connected to the sense amplifier output node.

5. The sense amplifier circuit of claim 1, wherein the current mirror includes a MOS transistor having third and fourth terminals connected to the bit line.

6. The sense amplifier circuit of claim 1, wherein the current mirror includes a plurality of electrically connected MOS transistors, wherein one of the electrically connected MOS transistors has two terminals connected to a terminal of another MOS transistor of the plurality of electrically connected MOS transistors.

7. The sense amplifier circuit of claim 1, wherein the current mirror includes a first transistor, a second transistor, and a third transistor, the first transistor having a drain connected to (i) a gate and a drain of the second transistor, and (ii) a gate of the third transistor.

8. The sense amplifier circuit of claim 1, wherein the current mirror includes:
   a first MOS transistor having a first terminal to which the second voltage is applied, a second terminal to which the second voltage is applied, a third terminal receiving the sensing enable signal, and a fourth terminal connected to the bit line;

a second MOS transistor having a first terminal to which the second voltage is applied, a second terminal to which the second voltage is applied, a third terminal connected to the bit line, and a fourth terminal connected to the bit line; and a third MOS transistor having a first terminal to which the second voltage is applied, a second terminal to which the second voltage is applied, a third terminal connected to the bit line, and a fourth terminal receiving the sensing enable signal.

9. The sense amplifier circuit of claim 5, wherein the current mirror includes:

a first MOS transistor having a first terminal to which the second voltage is applied, a second terminal to which the second voltage is applied, a third terminal receiving the sensing enable signal, and a fourth terminal connected to the bit line;

a second MOS transistor having a first terminal to which the second voltage is applied, a second terminal to which the second voltage is applied, a third terminal connected to the bit line, and a fourth terminal connected to the bit line; and a third MOS transistor having a first terminal to which the second voltage is applied, a second terminal to which the second voltage is applied, a third terminal connected to the bit line, and a fourth terminal receiving the sensing enable signal.

10. The sense amplifier circuit of claim 6, wherein the plurality of electrically connected MOS transistors includes:

a first MOS transistor having a first terminal to which the second voltage is applied, a second terminal to which the second voltage is applied, a third terminal receiving the sensing enable signal, and a fourth terminal connected to the bit line;

a second MOS transistor having a first terminal to which the second voltage is applied, a second terminal to which the second voltage is applied, a third terminal connected to the bit line, and a fourth terminal connected to the bit line; and a third MOS transistor having a first terminal to which the second voltage is applied, a second terminal to which the second voltage is applied, a third terminal connected to the bit line, and a fourth terminal receiving the sensing enable signal.

11. The sense amplifier circuit of claim 8, wherein the fourth terminal of the first MOS transistor is connected to the third terminal of the second MOS transistor, and the fourth terminal of the second MOS transistor is connected to the third terminal of the third MOS transistor.

12. The sense amplifier circuit of claim 9, wherein the fourth terminal of the first MOS transistor is connected to the third terminal of the second MOS transistor, and the fourth terminal of the second MOS transistor is connected to the third terminal of the third MOS transistor.

13. The sense amplifier circuit of claim 10, wherein the fourth terminal of the first MOS transistor is connected to the third terminal of the second MOS transistor, and the fourth terminal of the second MOS transistor is connected to the third terminal of the third MOS transistor.

14. A circuit, comprising the sense amplifier circuit of claim 1, and a nonvolatile memory sensed by the sense amplifier circuit.

15. The circuit of claim 14, wherein a cell of the nonvolatile memory is coupled to the bit line.

16. The circuit of claim 15, wherein when the sensing enable signal has the second state and current does not flow in the cell, a voltage having a logic high is applied to the sense amplifier output node, and a voltage having a logic low is output by the inverter.

17. The circuit of claim 16, wherein the current mirror includes a first transistor, a second transistor, and a third transistor, the first transistor having a drain connected to (i) a gate and a drain of the second transistor, and (ii) a gate of the third transistor.

18. The circuit of claim 17, wherein when the sensing enable signal has the second state and current flows in the cell, the voltage on the bit line has a level greater than a threshold voltage of the second and third transistors, a voltage having a logic low is applied to the sense amplifier output node, and a voltage having a logic high is output by the inverter.

\* \* \* \* \*